United States Patent
Wu et al.

(10) Patent No.: US 6,352,924 B1
(45) Date of Patent: Mar. 5, 2002

(54) REWORK METHOD FOR WAFERS THAT TRIGGER WCVD BACKSIDE ALARM

(75) Inventors: Jun Wu, Taoyuan; Ming Jer Lee, Hsinchu; Yu Ku Lin, Hsin-chu; Ying-Lang Wang, Taichung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/587,463

(22) Filed: Jun. 5, 2000

(51) Int. Cl.$^7$ ............................................... H01L 21/44
(52) U.S. Cl. ..................... 438/675; 438/685; 438/644; 438/648; 438/672; 252/79.1
(58) Field of Search ................... 438/672, 654, 438/675, 653, 698, 648, 643, 644, 656, 685; 252/79.1

(56) References Cited

U.S. PATENT DOCUMENTS

| | | | |
|---|---|---|---|
| 4,884,123 A | * 11/1989 | Dixit et al. | 357/71 |
| 4,960,732 A | * 10/1990 | Dixit et al. | 437/194 |
| 5,397,742 A | * 3/1995 | Kim | 437/190 |
| 5,672,543 A | 9/1997 | Chang et al. | 437/192 |
| 5,672,914 A | 9/1997 | Huang et al. | 257/763 |
| 5,688,718 A | 11/1997 | Shue | 437/190 |
| 5,759,437 A | 6/1998 | Datta et al. | 252/79.1 |
| 5,783,282 A | 7/1998 | Leiphart | 428/138 |
| 5,786,272 A | * 7/1998 | Marangon et al. | 438/628 |
| 5,827,777 A | * 10/1998 | Schinella et al. | 438/629 |
| 5,963,827 A | * 10/1999 | Enomoto et al. | 438/629 |
| 5,990,004 A | * 11/1999 | Yang et al. | 438/648 |
| 6,048,788 A | * 4/2000 | Huang et al. | 438/629 |
| 6,090,702 A | * 7/2000 | Okamoto | 438/637 |
| 6,150,259 A | * 11/2000 | Wu et al. | 438/628 |
| 6,174,563 B1 | * 1/2001 | Sugai | 427/97 |
| 6,177,338 B1 | * 1/2001 | Liaw et al. | 438/629 |
| 6,215,186 B1 | * 4/2001 | Konecni et al. | 257/751 |

* cited by examiner

Primary Examiner—Wael Fabmy, Jr.
Assistant Examiner—Fernando Toledo
(74) Attorney, Agent, or Firm—George O. Saile; Stephen B. Ackerman

(57) ABSTRACT

A new method is provided to replace tungsten plugs for wafers that trigger the WCVD backside alarm. In this new rework process, the original TiN glue layer is sputter etched back and a new ("fresh") 100-Angstrom thick layer of TiN is deposited. The new tungsten plug is created over the top surface of the refreshed glue layer.

14 Claims, 3 Drawing Sheets

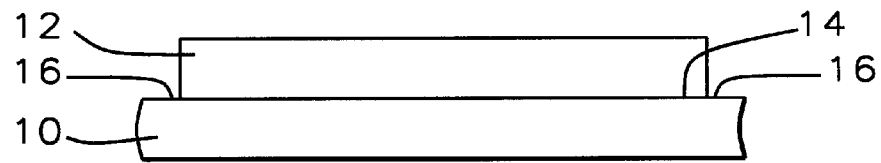
FIG. 1 - Prior Art
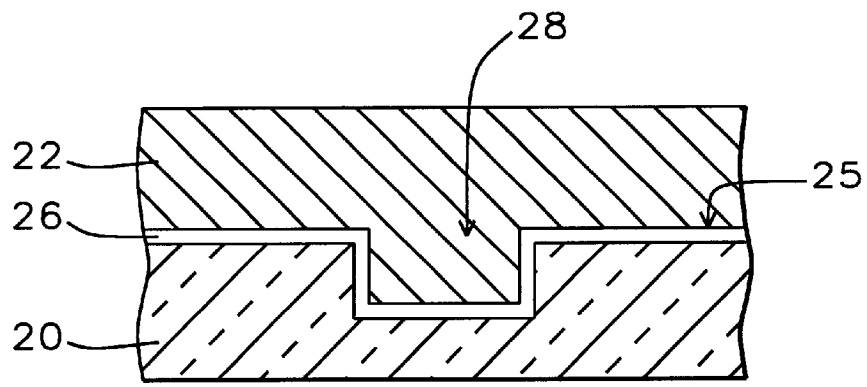
FIG. 2 - Prior Art
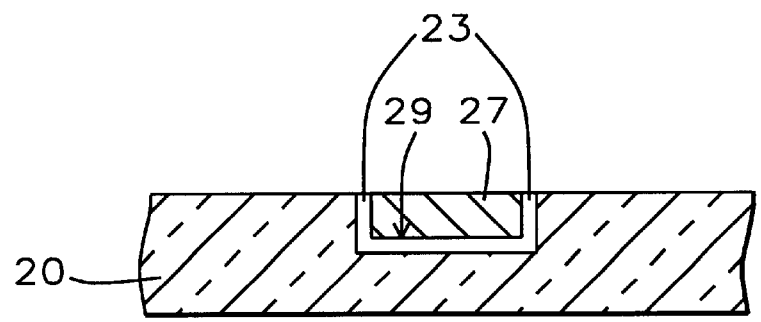
FIG. 3 - Prior Art

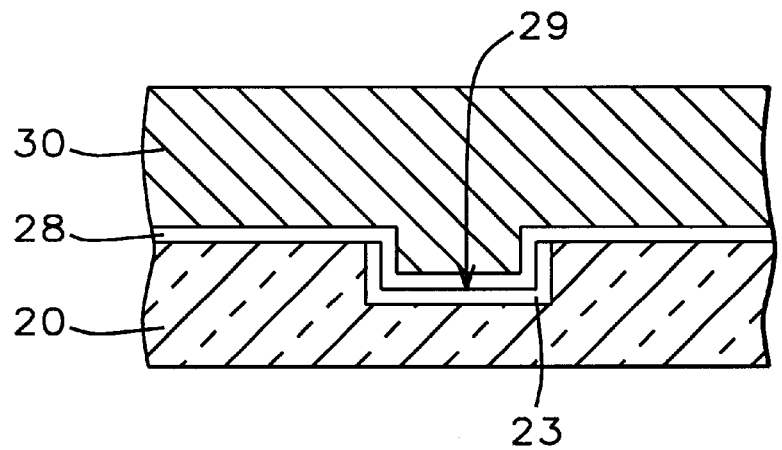
*FIG. 4 - Prior Art*
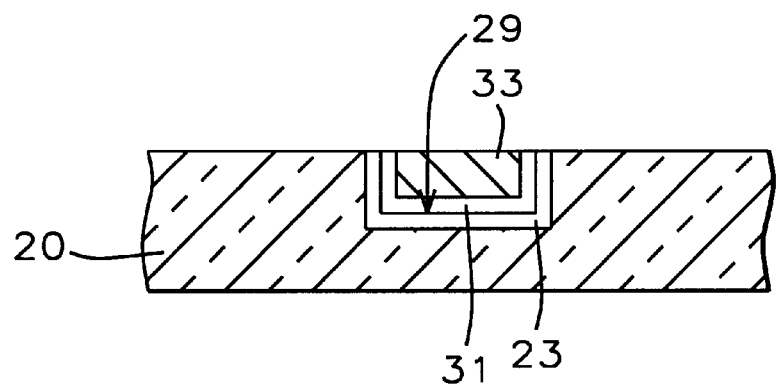
*FIG. 5 - Prior Art*

REWORK METHOD FOR WAFERS THAT TRIGGER WCVD BACKSIDE ALARM

BACKGROUND OF THE INVENTION

(1) Field of the Invention

The invention relates to the fabrication of integrated circuit devices, and, more particularly, to a method to rework tungsten plugs on the surface of a wafer by providing a new TiN glue-layer in the opening for the tungsten plug after which a layer of tungsten is re-deposited.

(2) Description of the Prior Art

In the formation of integrated circuits in a semiconductor substrate, the silicon wafer is populated with active devices. These active devices are isolated from adjacent active devices by well known techniques in the art such as the formation of Shallow Trench Isolation (STI) areas, of which the Burried Oxide (BOX) process is one example, and the creation of Field Oxide (FOX) isolation regions. The BOX process uses shallow trenches that are filled with a chemical vapor deposition (CVD) of silicon oxide ($SiO_2$) and then etched back or mechanically or chemically polished to yield a planar surface. The shallow trenches etched for the BOX process are anisotropically plasma etched into the silicon substrate and are typically between 0.5 and 0.8 micrometer (um.) deep. STI's are formed around active devices to a depth between 4000 and 20000 Angstrom.

The active devices that are formed in a semiconductor substrate are interconnected with specific electrical paths where thin-film paths of high-conductivity material are applied as the interconnection medium. An isolating layer shields the active devices from the environment; openings are created through the isolating layer through which the electrical contacts are established between the active devices and the network of interconnecting conducting wires. The electrical contacts that are in this manner established must be low resistivity contacts and must have good characteristics of planarity, connectivity and reliability. For devices in the micron and sub-micron scale, the requirement of fabricating good contact holes and vias imposes increasing demands of process complexity and control.

It is clear that it is important to overall device performance to create low-resistance ohmic contacts at the device level. One technique used to achieve this objective is the application of dopants in the area of the substrate where electrical contact has to be established. By increasing the dopant concentration in these contact areas, the contact resistance decreases, this up to the point where the dopant solubility has been reached for the area that is being doped for the temperature at which the dopant is introduced. A further factor that has an impact on plug contact resistance is the cleanliness of the substrate surface at the time that the contact plug is being formed. Unclean substrate surfaces will result in increased contact resistance and must therefore be avoided. A further concern is the formation of a layer of native oxide on the surface of the substrate due to the rapid oxidation of silicon when silicon is exposed to an oxygen ambient.

Current technology makes frequent use of contact plugs that use tungsten or, more recently, copper as filler for the contact openings.

For the formation of tungsten (W) contact holes, the process typically starts with the deposition of an insulating layer, openings are patterned into this layer in the areas where electrical contacts must be established with the active devices. Next a glue layer, typically of titanium, is deposited on the sidewalls and bottom of the created openings over which a barrier layer, typically of titanium nitride, is deposited. The barrier layer serves the purpose of preventing gasses, such as $WF_6$, that are created during the tungsten deposition, from penetrating into the tungsten that is being deposited and, in doing so, cause surface dislocations on the deposited tungsten. The deposition of the barrier layer of TiN can be enhanced by applying a Rapid Thermal Anneal (RTA) immediately after the barrier layer has been deposited and before the tungsten is deposited. The RTA improves the surface conformity of the deposited barrier layer. The barrier layer can be deposited by reactive sputtering or by Chemical Vapor Deposition (CVD). With increasingly smaller device dimensions, the CVD techniques offer the advantage of providing good conformity independent of the thickness of the deposited layer of TiN. The deposited layer of tungsten is etched back. The process of metalization can then be completed by depositing a layer of a conducting material, for instance aluminum, and patterning this layer into the desired interconnecting pattern. Care must be taken that during the etchback for the metalization pattern the previously deposited barrier layer is not removed from the top areas of the created contact holes thereby exposing the titanium underlayer. This would result in oxidation of the titanium underlayer, which would prevent the etching of the titanium layer resulting in residues that can cause electrical shorts in the metal interconnect.

Frequently used metal layers to form the metal interconnects are metal layers that react with the underlying silicon to form suicides. For this purpose titanium silicide can be used in view of the excellent operational characteristics of titanium silicide ($TiSi_2$) in a semiconductor environment. $TiSi_2$ has, for instance, excellent oxygen getter abilities while it forms good ohmic contact with both polysilicon and doped areas in single-crystal silicon. Silicides offer the advantage of reducing native oxide on the surface of the substrate after annealing processes. The titanium in the formed silicides reacts with native oxide and forms titanium oxide and titanium silicide, these materials are excellent conductors and remain on the surface of the formed silicide layer after the process of annealing has been completed.

As highlighted above, assuring adequate metal contact and metal continuity in contact windows and vias is important in establishing low resistivity contacts between metal layers and other device components. Where metal contacts are in the micron or sub-micron regions, metal penetration into the contact opening is often difficult to achieve and, as a consequence, step coverage at contacts of sputtered metal will be dramatically reduced. This has led to the formation of a number of different types of contact plugs; these contact plugs in essence use aluminum or tungsten as contact fill material.

Aluminum plugs have recently been investigated where the aluminum plug is formed at high temperatures. After deposition of the aluminum plug, the plug can be re-flowed by a high temperature anneal or by excimer laser to establish good plug planarity. Of these two approaches, the reflow process is the less desirable since this process causes plug junction damage due to the long time delay incurred before the solidification of aluminum, during this process of solidification the aluminum reacts with the barrier material. The excimer laser approach requires considerable laser power output since aluminum is a highly reflective material in the UV range; damage to the barrier layer is however avoided with this process. Using anti-reflective coatings can reduce the required laser output. The application of lasers for the formation of aluminum plugs however results in the formation of metal alloys with the aluminum, these alloys all have high resistivity and are therefore undesirable in a semiconductor device. For this reason this latter approach has so far not found wide application.

The formation of aluminum plugs has further been investigated by in situ reflow of cold aluminum. This leads to problems of aluminum wetting between the aluminum and the aluminum barriers, which in turn leads to the use of composite wetting barriers such as Ti/TiN and others. Overall, sub-micron contact openings make it difficult to use aluminum-based metalization as a contact hole fill material. It is difficult to deposit aluminum using CVD techniques while sputtered aluminum does not produce the desired material deposition that is needed to adequately fill sub-micron holes with aluminum. The not-uniform metal distribution in the openings filled with aluminum also makes the aluminum contact prone to electromigration, causing further concerns of contact reliability. Because of these problems in the use of aluminum, the semiconductor industry has predominantly used tungsten for contact holes filler, creating the via with Low Pressure CVD (LPCVD) technology. High current densities that occur in a micron or sub-micron device environment can also readily be handled by vias that use tungsten as a filler.

Wafer processing conditions, and specifically wafer plug formation before WCVD reaction sets in, are validated for plug planarity by applying pressure to selected locations on the backside of the wafer. Undesired or incorrect wafer processing conditions are detected in this manner whereby wafer backside pressure alarms indicate the occurrence of improper wafer processing conditions. Wafers that trigger the backside pressure alarm are then rejected from the wafer-processing stream and are, under normal circumstances, reworked. The invention addresses a rework method that is aimed at avoiding wafer losses caused by these undesirable conditions, the process of the invention thereby increases wafer yield and wafer throughput. A new wafer rework method is provided that ensures good plug-fill for processed wafers, thereby concentrating on tungsten plugs.

The typical deposition of a tungsten plug starts with the deposition of a dielectric layer, openings for the plug are created in the dielectric layer, including the inside sidewalls and bottom of the opening for the plug. A glue layer of TiN is then created over the dielectric openings. The two layers, that is the layer of dielectric and the layer of TiN, form the base layers over which the tungsten plug is deposited. The deposition of the tungsten plug, that is the WCVD process, starts with a $SiH_4$ soak that seeds the top surface of the glue layer with Si. The tungsten is after this blanket deposited over the surface of the Si-seeded layer and etched back to the surface of the TiN glue layer, thereby leaving only the tungsten fill in the tungsten plug opening. The sequence of layers created in this manner inside the hole for the tungsten plug is the TiN glue layer with a top surface that has been seeded with Si ions (due to the $SiH_4$ soak) over which the tungsten plug fill is deposited.

During the Prior Art rework cycle of tungsten plug fill, the WCVD process for tungsten re-deposition starts, after the removal of the original tungsten, with a $SiH_4$ soak, this soak forms a new seed layer of Si over the existing top surface of the layer of TiN. This results in a sequence of layers (in the opening for the tungsten plug starting from the bottom of the opening) of (original) TiN glue layer with a top surface that is seeded with Si ions and a (new) second layer of Si over the TiN glue layer. The new layer of tungsten is deposited over the second seed layer of Si. The double seed layers of Si created in this way (between the original glue layer of TiN and the new layer of tungsten) will cause over-etching during the subsequent tungsten etchback process (that is required to remove the blanket deposited layer of tungsten from the surface of the dielectric and to thereby form the tungsten plug) causing poor plug formation with a caved-in plug surface.

A high level of correlation has been observed between wafers that have been reworked in this Prior Art manner and wafers that fail the back-pressure test. The invention teaches a new method for the tungsten plug rework sequence, this new method dramatically reduces the failure rate of reworked wafers.

Referring now specifically to FIG. 1, there is shown a cross section of a heater table or chuck 10 onto which a wafer 12 is mounted. The purpose of the heater chuck 10 is to heat wafer 12 for various processing operations that are part of the semiconductor processing sequence. The heat generated by the heater table 10 is transferred to wafer 12 by convection, it is therefore important that there exists a complete and uniform physical contact between the heater table 10 and the wafer 12. The quality of this contact is evaluated using a backside pressure test, whereby the amount of pressure that can be applied to the backside of the wafer 12 is measured. A high pressure is an indication that good physical contact is being made between the heater chuck 10 and the surface of the wafer 12 that is in contact with the heater chuck. The planarity of the two surfaces 14 and 16 are well matched thereby establishing a large area of physical contact between the heater chuck 10 and the wafer 12 and, as a consequence, good heat transfer between these two bodies. As part of this test edge gasses, mostly process developed argon gasses, are purged via path 16 from between the contacting surfaces of the heater chuck 10 and the wafer 12.

The method used for applying the pressure between the two contacting surfaces (plane 14, FIG. 1) of the heater chuck 10 and the wafer 12 is not indicated in FIG. 1. This method can be a vacuum suck applied via a channel of the heater chuck, whereby the vacuum is supplied via a channel provided for that purpose in the heater chuck 10.

The following FIGS. 2 through 6 show the Prior Art process of tungsten plug rework.

The process of tungsten deposition is highlighted using FIG. 2. An opening 28 has been created for the purpose of forming a tungsten plug in an dielectric layer 20 of, for instance, $SiO_2$. The tungsten plug formation process starts with the formation of a layer 26 of TiN that serves as the glue layer for the tungsten. The WCVD process starts with a $SiH_4$ soak for 30 seconds under a pressure of 30 Torr, this soak seeds the top surface 25 of the TiN layer 26 with Si ions, a blanket deposition of tungsten layer 22 is then performed. Etching the layers that have been created on the surface of the dielectric completes the process of tungsten plug formation.

The processing conditions for the formation of the glue layer 26 of TiN are as follows: source: titanium nitride, deposited at a temperature of about 25 degrees C. for a time of about 10 seconds using a PVD process, deposited to a thickness of about 1000 Angstrom.

FIG. 3 show a cross section of the tungsten plug after the etch back has been completed. The sequence of layers in the hole for the tungsten plug is now as follows, starting from the bottom of the hole: the glue layer 23 of TiN and the tungsten plug 27. It must be noted at this point that the top surface 29 of the TiN glue layer 23 is Si-seeded as a result of the $SiH_4$ soak.

The tungsten etchback is performed using a RIE process at a temperature of about 400 degrees C., a pressure of about 450 mTorr for the duration of about 80 seconds, using $SF_6$ as an etchant.

The cross section of the tungsten plug as shown in FIG. 3 represents a tungsten plug that is either used (as is) or a plug that must be reworked. The rework cycles of this plug are further detailed in FIGS. 4 and 5 for the Prior Art rework cycle and in FIGS. 6, 7 and 8 for the rework cycle of the invention.

It must be noted that, for wafer that fail the backside pressure test, no W deposition has been performed as a consequence of which no W etchback is required for these wafers.

FIG. 4 shows a Prior Art cross section of the formation of a new tungsten plug. The formation of a new tungsten plug, that is described herein, implies that the old tungsten plug has first been removed, without such a removal a new tungsten plug could not be formed in the opening for the tungsten plug. A (new) layer 30 of tungsten is blanket deposited over the surface of the dielectric and the top surface 29 of the inside of the opening of the tungsten plug. This latter process again starts with a $SiH_4$ soak for 30 seconds under a pressure of 30 Torr, this soak seeds the top surface 29 of the TiN layer 23 with Si ions, further creating the Si layer 28 after which a blanket deposition of tungsten layer 30 is performed. FIG. 4 shows that the second Si-seed layer 28 is, within the opening for the tungsten plug, also deposited over the surface 29 of the original glue layer 23, remaining in the glue layer is the Si-seeded top part of this layer 23 that was created in the (original) deposition of the tungsten plug. The cross section of the reworked tungsten plug is shown in FIG. 5.

FIG. 5 shows a cross section of the Prior Art reworked tungsten plug. The sequence of layers within the opening of the tungsten plug 33 is as follows, starting from the bottom of the plug opening: the glue layer 23 of TiN (it must be noted that the top surface 29 of the glue layer 23 is still Si-seeded), the (new) seed layer 31 of Si and the (new, reworked) porous and rough tungsten remains inside the plug 33.

Therefore, the problem with conventional rework processing is that in Prior Art rework, only porous and rough tungsten remains in the plug opening after the tungsten etchback since the tungsten is typically over-etched. This remaining tungsten forms a very poor basis on which to rework the tungsten plug.

U.S. Pat. No. 5,783,282 (Leiphart) shows a process for forming TiN in a contact hole by sputtering TiN and then resputtering TiN using a PVD and a bias.

U.S. Pat. No. 5,672,543 (Chang et al.) shows a method to form a W plug using a PVD TiN glue layer.

U.S. Pat. No. 5,672,914 (Huang et al.) shows a dimple free W plug process using a TiN glue layer.

U.S. Pat. No. 5,688,718 (Shue) shows a W plug process using a TiN barrier layer.

U.S. Pat. No. 5,759,437 (Datta et al.) shows a C4 rework process that etches Ti—W.

SUMMARY OF THE INVENTION

A principle objective of the invention is to eliminate wafer losses due to tungsten plug-fill deficiencies.

It is another objective of the invention to provide a new and dependable wafer rework method, thereby avoiding wafer loss due to tungsten plug-fill deficiencies.

It is another objective of the invention to reduce wafer scrapping and wafer losses incurred during Wafer Acceptance Testing.

It is another objective of the invention to provide a dependable tungsten plug-fill method.

In accordance with the objectives of the invention a new method is provided for wafers that do not pass the WCVD backside pressure test. Before this test is performed, a Si-seeded layer has been formed on the TiN surface while the deposition of the tungsten has as yet not been performed. Sputter-etch of the coated TiN surface for about 100 Angstrom can remove the Si-seeded top layer from the original TiN glue layer and a new ("fresh") 100-Angstrom thick layer of TiN is deposited using Physical Vapor Deposition (PVD). A blanket tungsten layer is then re-deposited in the normal manner, that is a $SiH_4$ soak that forms a new layer of Si over the existing layer of TiN after which the new layer of tungsten is deposited. The tungsten plug is created by an etch back of the layers (of Si-seed and tungsten) that are overlying the dielectric adjacent to the plug hole.

The creation of a ("fresh") top surface of 100 Angstrom of TiN provides a method that removes the (original) Si-seed coated top part of the TiN layer and replaces it with a new (and not Si-seeded) layer of TiN, which becomes part of the (remaining, not etched back) layer of TiN. The top surface of the newly created layer of TiN is therefore not "contaminated" with the original Si-seeds, the new Si-seed layer is created on top of the newly deposited layer of 100 Angstrom of TiN.

BRIEF DESCRIPTION OF THE DRAWINGS

FIG. 1 shows a cross section of a Prior Art heater chuck with a wafer mounted on top of it.

FIG. 2 shows a cross-section of the formation of the original Prior Art tungsten plug before tungsten etch back.

FIG. 3 shows a cross-section of the formation of the original Prior Art tungsten plug after the tungsten etch back.

FIG. 4 shows a cross section of Prior Art tungsten plug rework after tungsten redeposition for the reworked tungsten plug.

FIG. 5 shows a cross section of Prior Art reworked tungsten plug.

DESCRIPTION OF THE PREFERRED EMBODIMENTS

Wafers that fail the indicated backside pressure test have been analyzed and the following facts have been learned from this analysis: these wafers often fail the Wafer Acceptance Test (WAT) and must then be scrapped. These wafer have been double-coated with a seed layer of silicon as indicated above under FIG. 5, these wafer frequently lead to tungsten plug loss during the subsequent tungsten etchback process. The latter observation can be explained be the fact that the etch rate for $WSi_x$, that is formed at the interface between silicon and tungsten, is faster than the etch rate for tungsten. The interface between the tungsten plug and the openings for the tungsten plug therefore becomes unstable resulting in plug loss.

Figure 6:
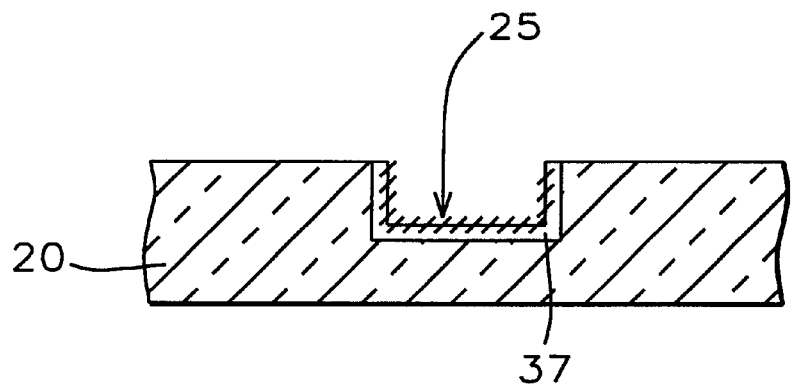
FIG. 6 shows a cross section of the plug that is being reworked after the (original) TiN glue layer has been etched back and re-deposited according to the invention.

FIG. 6 shows a cross section of the opening for a tungsten plug that is created in a layer of dielectric. The original glue layer of TiN is etched back as a first step in the process, this etch back removes about 100 Angstrom from the surface of the TiN layer. Depositing a "fresh" layer of TiN over the sputter-etched back layer restores the original thickness of the TiN glue layer 37. The sequence of layers inside the plug holes is now as follows, starting from the sidewalls of the hole: a TiN glue layer 37 from which the Si-seeded top surface has been removed and replaced with a fresh layer of TiN creating surface 25. The substrate is now ready for the deposition of a new layer of tungsten that is used to form the new, reworked tungsten plug.

The removal of the 100 Angstrom from the surface of the original glue layer of TiN applies a sputter-etch process using Ar as the sputtering ions.

The processing conditions for the deposition of the new 100 angstrom thick layer of TiN are as follows: the process used is a PVD process at a temperature of about 25 to 150 degrees C., a pressure of about 100 to 150 mTorr for a time duration of about 5 to 10 seconds using Ar as sputtering ions.

Figure 7:
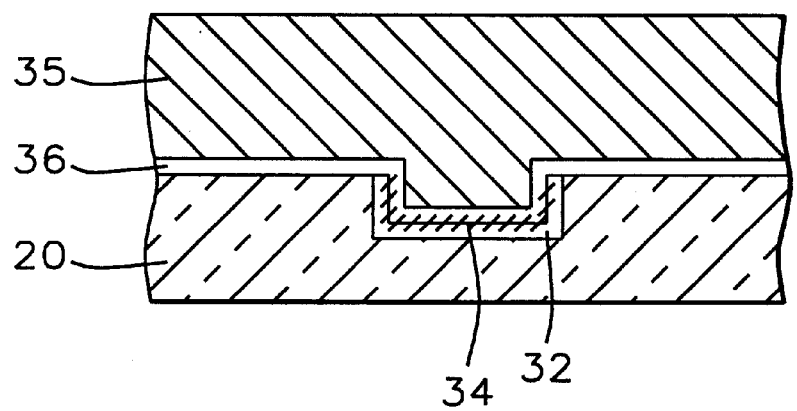
FIG. 7 shows a cross section after the re-deposition of tungsten during rework according to the invention.

FIG. 7 shows a cross section after the deposition of a new layer 35 of tungsten. The WCVD process starts with a 30 second $SiH_4$ soak under a pressure of 30 Torr thereby depositing a (new) seed layer 36 of silicon, after this the new layer 35 of tungsten is deposited. FIG. 7 shows that the seed Si layer 36 is deposited over the newly created surface 34 of the glue layer 32, this surface does not contain any seeded Si ions (they have been removed by the 100 Angstrom sputter etchback of the glue layer) but contains TiN (the newly deposited layer of 100 Angstrom of TiN). Inside the plug opening the layer sequence, starting from the bottom of the opening, is now as follows: the modified glue layer 32 with a top surface 34 of TiN (as opposed to the Prior Art Si-seeded top layer), the new Si-seed layer 36 and the redeposited layer of tungsten. Removing the tungsten and the Si-seed that overlay the dielectric layer then completes the process of creating the (reworked) tungsten plug.

The deposition of the tungsten layer 35 uses LPCVD processing, at a temperature between about 400 to 500 degrees C., to a thickness between about 4000 and 6000 Angstrom, using tungsten hexafluoride and silane as a source.

Figure 8:
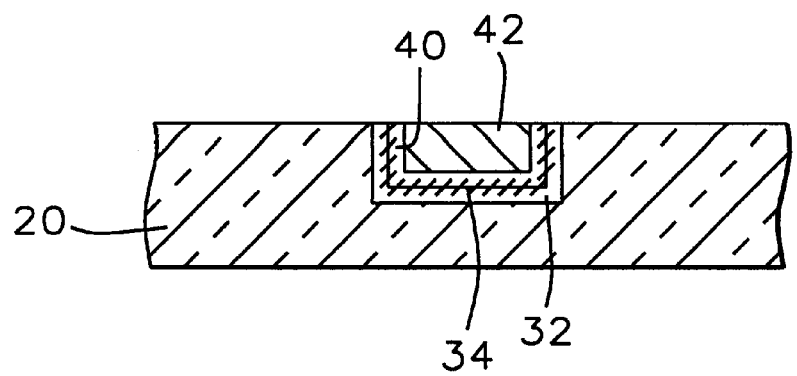
FIG. 8 shows a cross section of the completed reworked tungsten plug according to the invention.

FIG. 8 shows the completed, reworked plug with a layer sequence in the plug opening, starting at the sidewalls of the plug, of (reworked) TiN glue layer 32 with the reworked surface 34, a (new) Si-seed layer 40 and the (reworked) plug 42.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of reworking tungsten plug metalization, comprising the steps of:

providing a semiconductor surface, a layer of dielectric having been deposited over said semiconductor surface, a contact opening having been created in said layer of dielectric, said opening being lined with a TiN glue layer, said contact opening containing a first tungsten plug over said glue layer;

removing said first tungsten plug from said contact opening;

removing a top surface layer of said TiN glue layer by sputter etching;

depositing a new thin layer of TiN over said TiN glue layer; and re-depositing a second tungsten plug in said contact opening provided in said layer of dielectric, creating a reworked tungsten plug.

2. The method of claim 1 wherein said re-depositing a second tungsten plug is a blanket LPCVD process using a hot-wall, high temperature system with $WF_6$ as a source gas with a temperature range between about 400 and 500 degrees C. and a pressure range between about 30 and 90 Torr.

3. The method of claim 1 wherein said removing a top surface layer of said glue layer is a sputter etch process using Ar as a source gas at a temperature of between about 50 and 150 degrees C. and a pressure of between about 0.8 and 1.5 mTorr for a period of time between about 20 and 30 seconds thereby removing about 100 Angstrom from the top surface of said TiN glue layer.

4. The method of claim 1 wherein said depositing a thin layer of TiN over said TiN glue layer is a PVD process using titanium nitride as a source at a temperature between about 25 and 150 degrees C. and a pressure between about 100 and 150 mTorr for a time duration between about 5 and 10 seconds thereby depositing about 100 Angstrom of TiN on the top surface of said TiN glue layer.

5. The method of claim 1 wherein said dielectric layer is silicon oxide, deposited using either LPCVS, PECVD or APCVD processing, at a temperature between about 400 and 800 degrees C., to a thickness of about 5000 to 10000 Angstrom.

6. The method of claim 1 wherein said contact opening is formed via anisotropic, RIE etching using $CHF_3$ as an etchant, with said contact opening having a diameter between about 0.3 and 0.54 µm, resulting in an aspect ratio of said contact opening of between about 1 and 2.

7. The method of claim 1 wherein said glue layer is titanium nitride, deposited using r.f. sputtering, to a thickness between about 500 and 1000 Angstrom.

8. The method of claim 1 wherein said re-depositing a second tungsten plug uses LPCVD processing, at a temperature between about 400 to 500 degrees C., to a thickness between about 6000 and 8000 Angstrom, using tungsten hexafluoride and silane.

9. A method of reworking a first tungsten plug, said first tungsten plug having been created in a contact opening in an dielectric layer, said opening being lined with a glue layer, said first tungsten plug overlying said glue layer, comprising the steps of:

removing said first tungsten plug;

removing a top surface layer of said glue layer using a sputter etch process with Ar as a source gas at a temperature of between about 50 and 150 degrees C. and a pressure of between about 0.8 and 1.5 mTorr for a period of time between about 20 and 30 seconds thereby removing about 100 Angstrom from the top surface of said glue layer;

depositing a thin layer of TiN over said TiN glue layer using a PVD process with titanium nitride as a source under a temperature between about 25 and 150 degrees C. and a pressure between about 100 and 150 mTorr for a time duration between about 5 and 10 seconds thereby depositing about 100 Angstrom of TiN on the top surface of said TiN glue layer;

re-depositing a second tungsten plug in said contact opening using a blanket LPCVD process using a hot-wall, high temperature system with $WF_6$ as a source gas with a temperature range between about 400 and 500 degrees C. and a pressure range between about 30 and 90 Torr; and etching said re-deposited second tungsten plug down to the surface of said dielectric layer thereby forming said reworked tungsten plug.

10. The method of claim 9 wherein said re-depositing a second tungsten plug is a blanket LPCVD process using a hot-wall, high-pressure system with $WF_6$ as a source gas with a temperature range between about 400 and 500 degrees C. and a pressure range between about 30 and 90 Torr.

11. The method of claim 9 wherein said dielectric layer is silicon oxide, deposited using either LPCVS, PECVD or APCVD processing, at a temperature between about 400 and 800 degrees C., to a thickness of about 5000 to 10000 Angstrom.

12. The method of claim 9, said contact opening being formed via anisotropic, RIE etching using $CHF_3$ as an etchant, said contact opening having a diameter between about 0.3 and 0.54 µm, resulting in an aspect ratio of said contact opening of between about 1 and 2.

13. The method of claim 9 wherein said glue layer is titanium nitride, deposited using r.f. sputtering, to a thickness between about 500 and 1000 Angstrom.

14. The method of claim 9, said re-depositing a second tungsten plug comprising LPCVD processing, at a temperature between about 400 to 500 degrees C., to a thickness between about 6000 and 8000 Angstrom, using tungsten hexafluoride and silane.

\* \* \* \* \*